United States Patent
Shin et al.

(10) Patent No.: US 7,560,580 B2
(45) Date of Patent: Jul. 14, 2009

(54) ORGANIC-INORGANIC METAL HYBRID MATERIAL AND COMPOSITION FOR PRODUCING ORGANIC INSULATOR COMPRISING THE SAME

(75) Inventors: Jung Han Shin, Gyeonggi-Do (KR); Jae Jun Lee, Gyeonggi-Do (KR); Chang Ju Kim, Gyeonggi-Do (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 329 days.

(21) Appl. No.: 11/002,460

(22) Filed: Dec. 3, 2004

(65) Prior Publication Data

US 2006/0041096 A1 Feb. 23, 2006

(30) Foreign Application Priority Data

Aug. 17, 2004 (KR) .................. 10-2004-0064690

(51) Int. Cl.
*C07F 7/08* (2006.01)
(52) U.S. Cl. ....................................... 556/10
(58) Field of Classification Search .............. 556/10
See application file for complete search history.

(56) References Cited

U.S. PATENT DOCUMENTS

| 3,582,395 | A | * | 6/1971 | Adams et al. .............. 428/428 |
| 3,625,934 | A | * | 12/1971 | Rinse .................... 530/230 |
| 4,754,012 | A | * | 6/1988 | Yoldas et al. ............... 528/10 |
| 5,347,144 | A | | 9/1994 | Garnier et al. |
| 5,946,551 | A | | 8/1999 | Dimitrakopoulos et al. |
| 6,107,117 | A | | 8/2000 | Bao et al. |
| 6,586,791 | B1 | | 7/2003 | Lee et al. |

FOREIGN PATENT DOCUMENTS

JP 8-12718 A 1/1996
WO WO 00/79617 A1 12/2000

OTHER PUBLICATIONS

Tommie W. Kelley et al., "High Performances Organic Thin Film Transistors", Mat. Res. Soc. Symp. Proc., vol. 177, 2003, pp. 169-179.
Francis Garnier et al., "Molecular Engineering of Organic Semiconductors: Design of Self-Assembly Properties in Conjugated Thiophene Oligomers", J. Am. Chem. Soc., vol. 115, 1993, pp. 8716-8721.
H. Sirringhaus et al., "High-Resolution Inkjet Printing of All-Polymer Transistor Circuits", Science, vol. 290, Dec. 15, 2000, pp. 2123-2126.
Christos D. Dimitrakopoulos et al., "Low-Voltage, High-Mobility Pentacene Transistors with Solution-Processed High Dielectric Constant Insulators", Advanced Materials, vol. 11, No. 16, 1999, pp. 1372-1375.
Chinese Office Action, Chinese Application No. 2005100917789 dated Jan. 6, 2009, with English Translation.
Kobunshi Ronbunshu, vol. 59, No. 12, pp. 807-809, published in 2002.

* cited by examiner

*Primary Examiner*—Margaret G Moore
(74) *Attorney, Agent, or Firm*—Harness, Dickey & Pierce, P.L.C.

(57) ABSTRACT

An organic-inorganic metal hybrid material and a composition for producing an organic insulator comprising the hybrid material. The hybrid material shows high solubility in organic solvents and monomers, and superior adhesion to substrates. In addition, the hybrid material has a high dielectric constant and a high degree of crosslinking. Based on these advantages, the hybrid material or the composition can be applied to the fabrication of various electronic devices by a wet process.

6 Claims, 2 Drawing Sheets

ORGANIC-INORGANIC METAL HYBRID MATERIAL AND COMPOSITION FOR PRODUCING ORGANIC INSULATOR COMPRISING THE SAME

BACKGROUND OF THE INVENTION

This non-provisional application claims priority under 35 U.S.C. § 119(a) on Korean Patent Application No. 2004-64690 filed on Aug. 17, 2004, which is herein expressly incorporated by reference.

1. Field of the Invention

The present invention relates to an organic-inorganic metal hybrid material, and a composition for producing an organic insulator comprising the hybrid material.

2. Description of the Related Art

Most thin film transistors (TFTs) currently used in display devices consist of an amorphous silicon semiconductor, a silicon oxide insulating film and metal electrodes.

With the recent advances in various materials, organic TFTs using organic semiconductors have been developed (U.S. Pat. No. 5,347,144). Organic thin film transistors have been researched worldwide due to their applicability based on the new configuration. In particular, such organic thin film transistors have an economical advantage in that they can be fabricated by printing processes at ambient pressure, and further by roll-to-roll processes using plastic substrates, instead of conventional silicon processes, such as plasma-enhanced chemical vapor deposition (CVD).

Organic semiconductor materials for channel layers of organic thin film transistors are largely divided into low molecular weight materials or oligomers, e.g., melocyanine, phthalocyanine, perylene, pentacene, C60, thiophene oligomer, etc., and high molecular weight materials. Lucent Technologies Inc. and 3M Inc. developed devices with charge carrier mobilities as high as 3.2~5.0 cm$^2$/Vs using a pentacene single crystal (3M, Mat Res. Soc. Sym. Proc. 2003, Vol. 771, L6.5.1~L6.5.11). In addition, the companies reported a device having a relatively high charge carrier mobility of 0.01~0.1 cm$^2$/Vs (CNRS, J. Am. Chem. Soc., 1993, Vol. 115, pp. 8716~9721) and $I_{on}/I_{off}$ ratio using an oligothiophene derivative. However, the fabrication of these devices is mainly dependent on vacuum processes for thin film formation.

A number of organic thin film transistors (OTFTs) fabricated using a thiophene-based polymer as a high molecular weight material are reported. Although high molecular weight materials have poor device characteristics when compared to low molecular weight materials, they are advantageous in terms of their easy processability allowing them to be processed in a large area at low costs by a solution process, such as printing. Cambridge University and Seiko Epson Corp. have already fabricated and tested high molecular weight-based organic thin film transistors (charge carrier mobility: 0.01~0.02 cm$^2$/Vs) employing a polythiophene-based material (F8T2) (see, PCT Publication WO 00/79617, Science, 2000, vol. 290, pp. 2132~2126). Bao et. al. from Lucent Technologies Inc. disclosed the fabrication of organic thin film transistors (charge carrier mobility: 0.01~0.04 cm$^2$/Vs) employing P3HT, which is a regioregular polymer (U.S. Pat. No. 6,107,117). As noted above, these organic thin film transistors using high molecular weight materials have poor TFT device characteristics, including charge carrier mobility, compared to organic thin film transistors using pentacene as a low molecular weight material, but do not require a high operating frequency, and thus can be fabricated at low costs.

Studies on materials for insulating films which can be processed by a solution process are required in order to fabricate flexible organic thin film transistors at reduced cost, like the aforementioned organic semiconductor materials for channel layers. Further, studies on materials for insulating films are actively being undertaken to improve the performance of organic thin film transistors. Particularly, in an attempt to decrease threshold voltage, insulators having a high dielectric constant, for example, ferroelectric insulators, such as $Ba_xSr_{1-x}TiO_3$ (barium strontium titanate (BST)), $Ta_2O_5$, $Y_2O_3$, $TiO_2$, etc., and inorganic insulators, such as $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, $Bi_4Ti_3O_{12}$, etc., have been used as materials for inorganic insulating films (U.S. Pat. No. 5,946,551; and Adv. Mater., 1999, Vol. 11, pp. 1372~1375). However, these inorganic oxide materials do not have any significant advantages over conventional silicon materials in terms of processing.

As the application of OTFTs has been recently extended to not only LCD displays but also driving devices of flexible displays using an organic EL element, the OTFTs are required to have a charge carrier mobility of 10 cm$^2$/V-sec. or higher. However, since the OTFTs comprise organic insulating films having a dielectric constant of about 3 to about 4, they require a high driving voltage (30~50V) and a high threshold voltage (15~20V).

In an attempt to increase the dielectric constant of organic insulating films, dispersion of nanometer-sized ferroelectric ceramic particles in an insulating polymer is described in U.S. Pat. No. 6,586,791. But, this patent has some problems that the ceramic particles adversely affect the formation of an organic active layer, thus decreasing charge carrier mobility or increasing leakage current. To solve such problems, an additional organic material having sufficient insulating properties should be used to form a dual structure with the insulating polymer. Thus, there is a need in the art to develop an organic insulator that shows high dielectric constant, superior insulating properties, and excellent processability for better arrangement of organic semiconductor materials.

OBJECT AND SUMMARY

Therefore, the present invention has been made in view of the above problems, and a feature of the present invention is to provide a novel organic-inorganic metal hybrid material which is highly soluble in organic solvents and monomers, and has a high dielectric constant.

In accordance with one embodiment of the present invention, there is provided an organic-inorganic metal hybrid material represented by Formula 1 below:

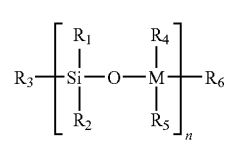

Formula 1 wherein n is an integer of 3 or less;

M is a metal atom selected from titanium, zirconium, hafnium and aluminum atoms;

$R_1$, $R_2$ and $R_3$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, $OMX_1X_2X_3$ (in which M is a metal atom selected from titanium, zirconium, hafnium and aluminum atoms; and $X_1$, $X_2$ and $X_3$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, or a halogen atom), or a halogen atom; and $R_4$, $R_5$ and $R_6$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, $OSiX_1X_2X_3$ (in which $X_1$, $X_2$ and $X_3$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, or a halogen atom), or a halogen atom.

In accordance with another embodiment of the present invention, there is provided a composition for producing an organic insulator, the composition comprising (i) the organic-inorganic metal hybrid material, (ii) a monomer and/or an organic polymer, and (iii) a solvent dissolving the components (i) and (ii).

In accordance with another embodiment of the present invention, there is provided an electronic device fabricated using the composition.

In accordance with another embodiment of the present invention, there is provided a method for producing an organic insulator which comprises coating the composition on a substrate, and curing the coated substrate.

In accordance with another embodiment of the present invention, there is provided an organic insulator produced by coating the composition on a substrate, and curing the coated substrate.

In accordance with still another embodiment of the present invention, there is provided an organic thin film transistor comprising a substrate, a gate electrode, an insulating layer, an organic semiconductor layer, and a plurality of pairs of source/drain electrodes wherein the insulating layer is made of the composition.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
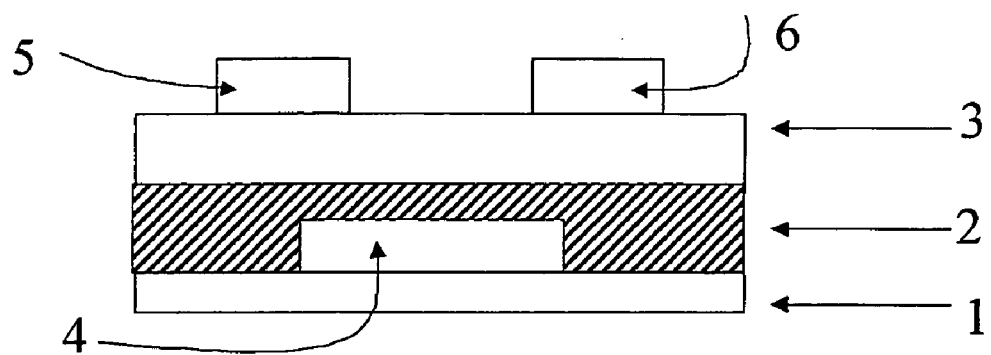
FIG. 1 is a cross-sectional view showing the structure of an organic thin film transistor fabricated in Example 1 of the present invention.

Embodiment of the present invention will now be described in more detail.

An embodiment of the present invention provides an organic-inorganic metal hybrid material represented by Formula 1 below:

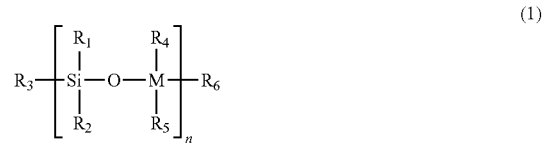

(1)

wherein n is an integer of 3 or less;

M is a metal atom selected from titanium, zirconium, hafnium and aluminum atoms;

$R_1$, $R_2$ and $R_3$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, $OMX_1X_2X_3$ (in which M is a metal atom selected from titanium, zirconium, hafnium and aluminum atoms; and $X_1$, $X_2$ and $X_3$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, or a halogen atom), or a halogen atom; and $R_4$, $R_5$ and $R_6$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, $OSiX_1X_2X_3$ (in which $X_1$, $X_2$ and $X_3$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, a $C_{1\sim10}$ alkoxy group, or a halogen atom), or a halogen atom.

The organic-inorganic metal hybrid material of the present invention is prepared by hydrolysis or polycondensation of at least one organosilane compound selected from the compounds of Formulae 2a to 2c below:

$SiX^1X^2X^3X^4$  Formula 2a wherein $X^1$, $X^2$, $X^3$ and $X^4$ are each independently a halogen atom, or a $C_{1\sim10}$ alkoxy group, at least one of these substituents being a hydrolysable functional group;

$R^1SiX^1X^2X^3$  Formula 2b wherein $R^1$ is a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, or a $C_{1\sim10}$ alkoxy group; and $X^1$, $X^2$ and $X^3$ are as defined in Formula 2c;

wherein $R^1$ and $R^2$ are each independently a hydrogen atom, a $C_{1\sim10}$ alkyl group, a $C_{3\sim10}$ cycloalkyl group, a $C_{6\sim15}$ aryl group, a $C_{3\sim30}$ alkyl group or cycloalkyl group substituted with an acryloyl group, an acryloyloxy group or an epoxy group, a vinyl group, an allyl group, an acryloyloxy group, an epoxy group, or a $C_{1\sim10}$ alkoxy group; and $X^1$ and $X^2$ are as defined in Formula 2a, and an organometallic compound in the presence of an acid or base catalyst.

Organometallic compounds usable in the present invention include those having superior insulating properties and a high dielectric constant, particularly, metal oxides having a dielectric constant of 4 or more. Non-limiting examples of the organometallic compound include:

1) titanium-based compounds, such as titanium (IV) n-butoxide, titanium (IV) t-butoxide, titanium (IV) ethoxide, titanium (IV) 2-ethylhexoxide, titanium (IV) isopropoxide, titanium (IV) (diisopropoxide) bis(acetylacetonate), titanium (IV) oxide bis(acetylacetonate), trichlorotris(tetrahydrofuran)titanium (III), tris(2,2,6,6-tetramethyl-3,5-heptanedionato)titanium (III), (trimethyl) pentamethyl cyclopentadienyl titanium (IV), pentamethylcyclopentadienyltitanium trichloride (IV), pentamethylcyclopentadienyltitanium trimethoxide (IV), tetrachlorobis(cyclohexylmercapto) titanium (IV), tetrachlorobis(tetrahydrofuran)titanium (IV), tetrachlorodiaminetitanium (IV), tetrakis(diethylamino)titanium (IV), tetrakis(dimethylamino)titanium (IV), bis(t-butylcyclopentadienyl)titanium dichloride, bis(cyclopentadienyl)dicarbonyl titanium (II), bis(cyclopentadienyl)titanium dichloride, bis(ethylcyclopentadienyl)titanium dichloride, bis(pentamethylcyclopentadienyl)titanium dichloride, bis(isopropylcyclopentadienyl)titanium dichloride, tris(2,2,6,6-tetramethyl-3,5-heptanedionato)oxotitanium (IV), chlorotitanium triisopropoxide, cyclopentadienyltitanium trichloride], dichlorobis(2,2,6,6-tetramethyl-3,5-heptanedionato)titanium (IV), dimethylbis(t-butylcyclopentadienyl)titanium (IV), and di(isopropoxide)bis(2,2,6,6-tetramethyl-3,5-heptanedionato)titanium (IV);

2) zirconium-based and hafnium-based compounds, such as zirconium (IV) n-butoxide, zirconium (IV) t-butoxide, zirconium (IV) ethoxide, zirconium (IV) isopropoxide, zirconium (IV) n-propoxide, zirconium (IV) acetylacetonate, zirconium (IV) hexafluoroacetylacetonate, zirconium (IV) trifluoroacetylacetonate, tetrakis(diethylamino)zirconium, tetrakis(dimethylamino)zirconium, tetrakis(2,2,6,6-tetramethyl-3,5-heptanedionato)zirconium (IV), zirconium (IV) sulfate tetrahydrate, hafnium (IV) n-butoxide, hafnium (IV) t-butoxide, hafnium (IV) ethoxide, hafnium (IV) isopropoxide, hafnium (IV) isopropoxide monoisopropylate, hafnium (IV) acetylacetonate, and tetrakis(dimethylamino) hafnium; and 3) aluminum-based compounds, such as aluminum n-butoxide, aluminum t-butoxide, aluminum s-butoxide, aluminum ethoxide, aluminum isopropoxide, aluminum acetylacetonate, aluminum hexafluoroacetylacetonate, aluminum trifluoroacetylacetonate, and tris(2,2,6,6-tetramethyl-3,5-heptanedionato)aluminum.

The acid or base catalyst used to prepare the organic-inorganic metal hybrid material of Formula 1 is preferably at least one catalyst selected from the group consisting of hydrochloric acid, nitric acid, benzene sulfonic acid, oxalic acid, formic acid, potassium hydroxide, sodium hydroxide, triethylamine, sodium bicarbonate, and pyridine.

The molar ratio of the catalyst used during the hydrolysis and polycondensation to the reactants (i.e., the organosilane-based compound and the organic metal compound) is preferably in the range of from 1:0.000001 to 1:10.

On the other hand, the molar ratio of the water used during the hydrolysis and polycondensation to the reactants is preferably in the range of 1:1 to 1:1000.

The hydrolysis and the polycondensation are preferably carried out at −40° C.~150° C. for 0.1~100 hours.

As preferred organic solvents usable to prepare the organic-inorganic metal hybrid material, there may be mentioned, for example: aliphatic hydrocarbon solvents, such as hexane; aromatic hydrocarbon solvents, such as anisole, mesitylene and xylene; ketone-based solvents, such as methyl isobutyl ketone, 1-methyl-2-pyrrolidinone, acetone and cyclohexanone; ether-based solvents, such as tetrahydrofuran and isopropyl ether; acetate-based solvents, such as ethyl acetate, butyl acetate and propylene glycol methyl ether acetate; alcohol-based solvents, such as isopropyl alcohol and butyl alcohol; amide-based solvents, such as dimethylacetamide and dimethylformamide; silicon-based solvents; and mixtures thereof.

The molecular weight of the organic-inorganic metal hybrid material thus prepared is preferably in the range of 200~2,000, but is not particularly limited to this range.

The present invention also provides a composition for producing an organic insulator, comprising: i) the organic-inorganic metal hybrid material; ii) a monomer and/or an organic polymer; and iii) a solvent dissolving the components i) and ii).

The content of the organic-inorganic metal hybrid material in the composition of the present invention is dependent on the kind of the monomer or the organic polymer and the solvent used, and on film formation conditions, but is preferably in the range of 0.1~30 parts by weight, and more preferably 0.5~10 parts by weight, based on 100 parts by weight of the composition. When the content of the organic-inorganic metal hybrid material exceeds 30 parts by weight, there is a problem that the crosslinked mixture is gelled. On the other hand, when the content of the hybrid material is below 0.1 parts by weight, the degree of crosslinking may be low, deteriorating the solvent resistance of a thin film to be formed.

Specific examples of suitable monomers for the preparation of the composition according to the present invention include, but are not limited to, methyl methacrylate, methyl acrylate, allyl methacrylate, allyl acrylate, methacrylic acid, acrylic acid, 2-hydroxyethyl methacrylate, 2-hydroxyethyl acrylate, glycidyl methacrylate, glycidyl acrylate, bisphenol A dimethacrylate, 2-(dimethylamino)ethyl methacrylate, 2-(dimethylamino)ethyl acrylate, ethylene glycol dimethacrylate, ethylene glycol diacrylate, trimethylolpropane trimethacrylate, trimethylolpropane triacrylate, n-butyl methacrylate, n-butyl acrylate, stearyl methacrylate, stearyl acrylate, 1,6-hexanediol dimethacrylate, 1,6-hexanediol diacrylate, pentaerythritol triacrylate, 2,2,2-trifluoroethyl methacrylate, 2,2,2-trifluoroethyl acrylate, 2-cyanoethyl acrylate, diethylene glycol dimethacrylate, diethylene glycol diacrylate, 2-bromoethyl acrylate, D,L-menthyl methacrylate, D,L-menthyl acrylate, 1H,1H-perfluorooctyl methacrylate, 1H,1H-perfluorooctyl acrylate, 1,1,1,3,3,3-hexafluoroisopropyl methacrylate, 1,1,1,3,3,3-hexafluoroisopropyl acrylate, 1,4-cyclohexanedimethyl 1,4-dimethacrylate, 1,4-cyclohexanedimethyl 1,4-diacrylate, barium methacrylate, zinc methacrylate, methallyl methacrylate, cinnamyl methacrylate, cinnamyl acrylate, acryloxy tri-N-butyltin, methacryloxypropylmethyl dichlorosilane, trimethylsilyl methacrylate, trimethylsilyl acrylate, 2-(methacryloxyl)ethyl acetoacetate, 1,3-bis(3-methacryloxypropyl)tetramethyldisiloxane, 3-methacrylpropyltris(vinyldimethylsiloxy)silane, vinyl acrylate, vinyl acetate, vinyl chloroformate, vinyl trifluoroacetate, 2-chloroethyl vinyl ether, 1,6-hexanediol divinyl ether, di(ethylene glycol) vinyl ether, 2-ethylhexanoic acid vinyl ester, styrene, α-methyl styrene, 4-bromostyrene, 4-acetoxystyrene, 4-methoxystyrene, 2-vinylnaphthalene, 2,3,4,5,6-pentafluorostyrene, 3,4-dimethoxy-1-vinylbenzene, 4-vinylbiphenyl, N-vinyl-2-pyrrolidone, N-vinylcarbazole, ethylene glycol diglycidyl ether, 1,4-butanediol diglycidyl ether, 1,4-cyclohexanedimethanol diglycidyl ether, bisphenol A diglycidyl ether, glycerol diglycidyl ether, glycerol propoxylate triglycidyl ether, triphenylolmethane triglycidyl ether, 4-vinylcylcohexane dioxide, dicyclopentadiene diepoxide, diglycidyl ether, 1,3-bis(3-glycidoxypropyl) tetramethyldisiloxane, 1,2-cyclohexanedicarboxylic acid diglycidyl ester, 1,4-bis(glycidyloxy)benzene, trimethylolpropane triglycidyl ether, 3,7,14-tris[[3-(epoxypropoxy)propyl]dimethylsilyloxy]-1,3,5,7,9,11,14-heptacyclopentyltricyclo[7,3,3,15,11]heptasiloxane, N,N-diglycidylaniline, 9,9-bis[4-(glycidyloxy)phenyl]fluorene, triglycidyl isocyanurate, bis[4-(2,3-epoxy-propylthio)phenyl]sulfide, resorcinol diglycidyl ether, 2,6-di(oxiran-2-ylmethyl)-1,2,3,5,6,7-hexahydropyrrolo[3,4,F] isoindole-1,3,5,7-tetraone, santolink XI-100, 1,2,7,8-diepoxyoctane, 1-methyl-4-(1-methylepoxyethyl)-7-oxabicyclo[4,1,0]heptane, 3,4-epoxycyclohexylmethyl-3,4-epoxycyclohexylcarboxylate, glycidyl acrylate, glycidyl methacrylate, 4,4'-methylenebis (N,N-diglycidylaniline), bis(3,4-epoxycyclohexylmethyl) adipate, 1,2-epoxy-4-vinylcyclohexane, 2-(3,4-epoxycyclohexyl)ethyltrimethoxysilane, and the like.

The content of the monomer in the composition of the present invention is preferably in the range of 1~40 parts by weight, and more preferably 5~20 parts by weight, based on 100 parts by weight of the composition. When the content of the monomer exceeds 40 parts by weight, there is a risk that the flexibility of a thin film to be formed is poor. Meanwhile, when the content of the monomer is less than one part by weight, the degree of crosslinking may be low, deteriorating the solvent resistance of a thin film to be formed.

Non-limiting examples of suitable organic polymers for the preparation of the composition of the present invention include polyesters, polycarbonates, polyvinylalcohols, polyvinylbutyrals, polyacetals, polyarylates, polyamides, polyamidimides, polyetherimides, polyphenyleneethers, polyphenylenesulfides, polyethersulfones, polyetherketones, polyphthalamides, polyethernitriles, polyethersulfones, polybenzimidazoles, polycarbodiimides, polysiloxanes, polymethylmethacrylates, polymethacrylamides, nitrile rubbers, acryl rubbers, polyethylenetetrafluorides, epoxy resins, phenol resins, melamine resins, urea resins, polybutenes, polypentenes, poly(ethylene-co-propylene), poly(ethylene-co-butenediene), polybutadienes, polyisoprenes, poly(ethyleneco propylene diene), butyl rubbers, polymethylpentenes, polystyrenes, poly(styrenebutadiene), hydrogenated poly(styrene-co-butadiene), hydrogenated polyisoprenes, hydrogenated polybutadienes, and the like.

The content of the organic polymer in the composition of the present invention is preferably in the range of 1~30 parts by weight, and more preferably 1~20 parts by weight, based on 100 parts by weight of the composition. When the content of the organic polymer exceeds 30 parts by weight, there is a risk that the degree of crosslinking is low, deteriorating the solvent resistance of a thin film to be formed.

Non-limiting examples of suitable organic solvents for the preparation of the composition of the present invention include cyclohexanone, chloroform, chlorobenzene, ethylneglycolmonomethylether, propyleneglycolmethyletheracetate, ethyllactate, toluene, xylene, methyl ethyl ketone, 4-heptanone, methanol, butanol, acetone, N-methylformamide, N-methylpyrrolidone, triphenylimidazole, etc. The amount of the organic solvent used is in the range of 0~98.9 parts by weight.

The composition of the present invention can be used to fabricate, without limitation, transistors and diodes for use in electronic devices, including photovoltaic devices, organic light-emitting devices (LEDs), sensors, memory devices and switching devices.

The present invention also provides a method for producing an organic insulator by coating the composition on a substrate, and curing the coated substrate.

The coating can be carried out by spin coating, dip coating, printing, spray coating, or roll coating.

The curing is carried out by heating the coated substrate to 50° C. or higher for at least one minute. The organic insulator thus produced shows superior insulating properties.

The present invention also provides an organic thin film transistor comprising the organic insulator as an insulating layer. The organic thin film transistor of the present invention has a high charge carrier mobility, low driving and threshold voltages, and a high $I_{on}/I_{off}$ ratio. In addition, the organic thin film transistor of the present invention is highly stable in subsequent processing. In particular, a gate insulating film can be formed using the composition of the present invention by a common wet process, such as printing or spin coating, but its performance is comparable to that of inorganic insulating films formed by chemical vapor deposition.

FIG. 1 shows the structure of an organic thin film transistor fabricated in Example 1 of the present invention. The figure is provided as one preferred embodiment of the present invention only, and various organic thin film transistors are possible so long as the object of the present invention is not impaired.

The substrate may be made of plastic, glass, silicon, etc.

Suitable materials for the organic active layer are those commonly used in the art, and their specific examples include, but are not limited to, pentacenes, copper phthalocyanines, polythiophenes, polyanilines, polyacetylenes, polypyrroles, polyphenylene vinylenes, and derivatives thereof.

Suitable materials for the gate electrode and the source/drain electrodes are metals commonly used in the art, and their specific examples include, but are not limited to, gold, silver, aluminum, nickel, indium-tin oxides, and others.

Hereinafter, the present invention will be described in more detail with reference to the following examples. However, these examples are provided only for illustrative purposes and are not to be construed as limiting the scope of the present invention.

PREPARATIVE EXAMPLE 1

Preparation of Organic-Inorganic Metal Hybrid Material A 0.12 moles (4.83 g) of sodium hydroxide and 50 ml of tetrahydrofuran (THF) were placed in a reaction flask. The temperature of the flask was cooled to 0° C. After 0.48 moles (70 ml) of vinyltrimethoxysilane was added to the flask, the reaction temperature was gradually raised to room temperature. The reaction mixture was allowed to react at room temperature for 12 hours. Volatile materials were completely evaporated at a pressure of ca. 0.1 torr to obtain sodium silanolate as a solid. After the solid compound was dissolved in 250 ml of THF, the resulting solution was cooled to 0° C. To the solution was slowly added 31.27 g of 95% chlorotitanium triisopropoxide (Aldrich). The mixture was further allowed to react for 12 hours at room temperature, and was then concentrated at a reduced pressure of ca. 0.1 torr to remove volatile materials. 200 ml of hexane was added to the concentrate, and the resulting mixture was filtered through celite. The obtained filtrate was concentrated at a reduced pressure of 0.1 torr to remove the hexane, affording a highly viscous liquid compound.

Figure 2:
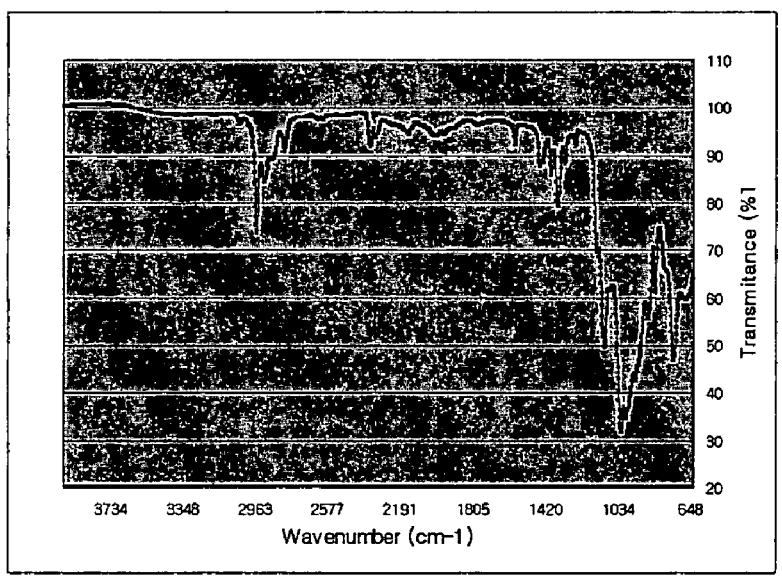
FIG. 2 is an infrared spectrum of an organic-inorganic metal hybrid material prepared in Preparative Example 1 of the present invention.

As can be seen from the IR spectrum shown in FIG. 2, strong absorption peaks corresponding to the Ti—O—Si bonds are observed around 960 cm$^{-1}$, which indicates that the organic-inorganic metal hybrid material A was prepared.

PREPARATIVE EXAMPLE 2

Preparation of Organic-Inorganic Metal Hybrid Material B 0.12 moles (4.83 g) of sodium hydroxide and 50 ml of tetrahydrofuran (THF) were placed in a reaction flask. The temperature of the flask was cooled to 0° C. After 0.48 moles (114 ml) of methacryloxypropyltrimethoxysilane was added to the flask, the reaction temperature was gradually raised to room temperature. The reaction mixture was allowed to react at room temperature for 12 hours. Volatile materials were completely evaporated at a pressure of ca. 0.1 torr to obtain sodium silanolate as a solid. After the solid compound was dissolved in 250 ml of THF, the resulting solution was cooled to 0° C. To the solution was slowly added 31.27 g of 95% chlorotitanium triisopropoxide (Aldrich). The mixture was further allowed to react for 12 hours at room temperature, and was then concentrated at a reduced pressure of ca. 0.1 torr to remove volatile materials. 200 ml of hexane was added to the concentrate, and the resulting mixture was filtered through celite. The obtained filtrate was concentrated at a reduced pressure of 0.1 torr to remove the hexane, affording a highly viscous liquid compound.

Figure 3:
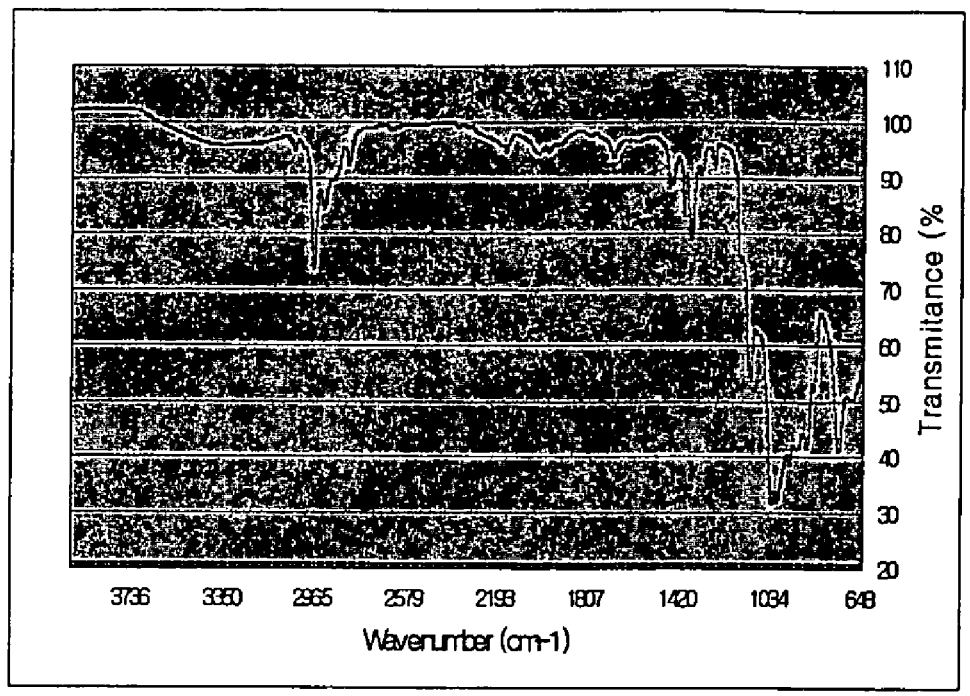
FIG. 3 is an infrared spectrum of an organic-inorganic metal hybrid material prepared in Preparative Example 2 of the present invention.

As can be seen from the IR spectrum shown in FIG. 3, strong absorption peaks corresponding to the Ti—O—Si bonds are observed around 960 cm$^{-1}$, which indicates that the organic-inorganic metal hybrid material B was prepared.

PREPARATIVE EXAMPLE 3

Preparation of Composition (1) for Producing Organic Insulator Comprising Organic-Inorganic Metal Hybrid Material 0.3 g of the organic-inorganic metal hybrid material A prepared in Preparative Example 1, 1.0 g of trimethylolpropane trimethacrylate (Aldrich), 0.01 g of benzoyl peroxide (Aldrich), and 3.0 g of polyvinylphenol (Aldrich, weight-average molecular weight: 8,000) were dissolved in 27 ml of cyclohexanone to prepare a composition (1) for producing an organic insulator.

PREPARATIVE EXAMPLE 4

Preparation of Composition (2) for Producing Organic Insulator Comprising Organic-Inorganic Metal Hybrid Material 0.3 g of the organic-inorganic metal hybrid material A prepared in Preparative Example 1, 0.5 g of glycidyl methacrylate (Aldrich), 0.01 g of benzoyl peroxide (Aldrich), and 2.0 g of poly(vinylbutyral-co-vinylalcohol-co-vinylacetate) (Aldrich) were dissolved in 10 ml of butanol to prepare a composition (2) for producing an organic insulator.

PREPARATIVE EXAMPLE 5

Preparation of Composition (1) for Producing Organic Insulator Comprising Organic-Inorganic Metal Hybrid Material A composition (3) for producing an organic insulator was prepared in the same manner as in Preparative Example 4, except that the organic-inorganic metal hybrid material B prepared in Preparative Example 2 was used instead of the organic-inorganic metal hybrid material A.

COMPARATIVE PREPARATION EXAMPLE 1

Preparation of Composition for Producing Organic Insulator Comprising No Organic-Inorganic Metal Hybrid Material A composition for producing an organic insulator was prepared in the same manner as in Preparative Example 3, except that no organic-inorganic metal hybrid material was used.

EXAMPLE 1

Fabrication of Organic Thin Film Transistor by Using Organic-Inorganic Metal Hybrid Material In this example, a commonly known top-contact organic thin film transistor was fabricated. First, Al was deposited on a washed glass substrate by a vacuum deposition technique to form a gate electrode having a thickness of 1,500 Å. The composition (1) prepared in Preparative Example 3 was spin-coated on the gate electrode to a thickness of 7,000 Å, and baked at 70° C. for 1 hour and 100° C. for 30 minutes to form an insulating layer. Next, pentacene was deposited on the insulating layer to a thickness of 700 Å by organic molecular beam deposition (OMBD) to form an organic active layer. At this time, the deposition was conducted under a vacuum pressure of $2 \times 10^{-6}$ torr, a substrate temperature of 80° C. and a deposition rate of 0.3 Å/sec. Then, source-drain electrodes were formed on the active layer with a shadow mask having a channel length of 100 μm and a channel width of 1 mm to fabricate the final top-contact organic thin film transistor.

EXAMPLE 2

An organic thin film transistor was fabricated in the same manner as in Example 1, except that the composition (2) prepared in Preparative Example 4 was used instead of the composition (1). The driving characteristics of the organic thin film transistor were then measured.

EXAMPLE 3

An organic thin film transistor was fabricated in the same manner as in Example 1, except that the composition (3) prepared in Preparative Example 5 was used instead of the composition (1). The organic thin film transistor was measured for the driving characteristics.

COMPARATIVE EXAMPLE 1

Fabrication of Organic Thin Film Transistor Comprising No Organic-Inorganic Metal Hybrid Material An organic thin film transistor was fabricated in the same manner as in Example 1, except that the composition prepared in Comparative Preparation Example 1 was used instead of the composition (1). The organic thin film transistor was measured for the driving characteristics.

Figure 4:
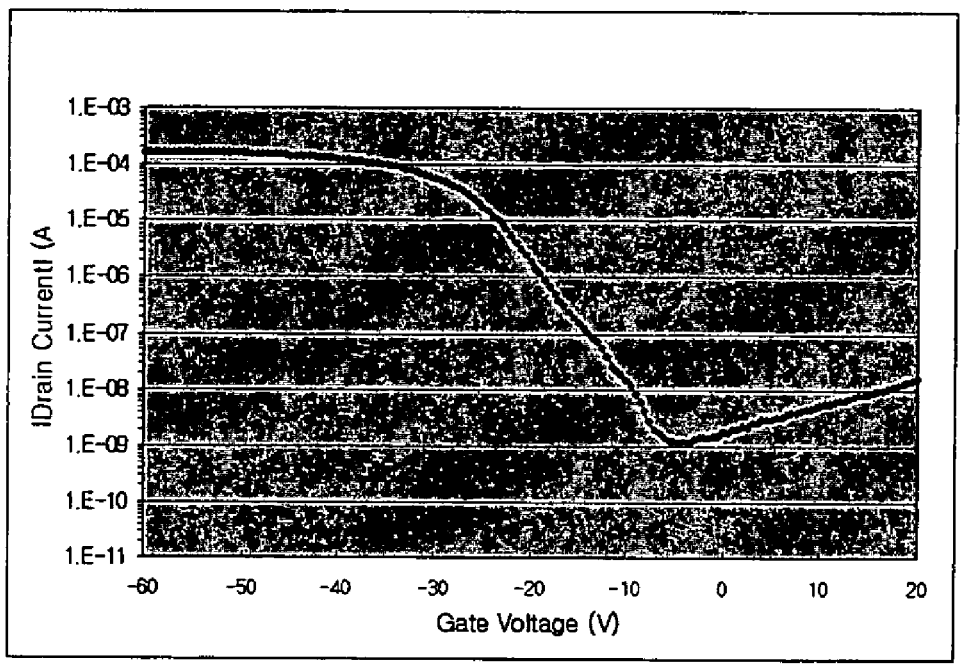
FIG. 4 is a graph showing driving characteristics of an organic thin film transistor fabricated in Example 1 of the present invention.

The current flowing between the respective source-drain electrodes of the organic thin film transistors fabricated in Examples 1 to 3 and Comparative Example 1 was measured in response to the voltages applied to the respective gate electrodes, and curves were plotted (FIG. 4). The measurement was done using a KEITHLEY semiconductor analyzer (4200-SCS). The driving characteristics of the transistors, including threshold voltage, $I_{on}/I_{off}$ and charge carrier mobility, were determined in accordance with the following procedures.

(1) Charge Carrier Mobility and Threshold Voltage

The charge carrier mobility was calculated from the slope of a graph representing the relationship between $(I_{SD})^{1/2}$ and $V_G$ by the following equation:

$$\mu_{FET} = (slope)^2 \frac{2L}{C_0 W}$$

At this time, the graph was plotted according to the following current equations in the saturation region:

$$I_{SD} = \frac{WC_0}{2L} \mu (V_G - V_T)^2$$

$$\sqrt{I_{SD}} = \sqrt{\frac{\mu C_0 W}{2L}} (V_G - V_T)$$

and the slope was calculated by the following equation:

$$slope = \sqrt{\frac{\mu C_0 W}{2L}}$$

In the above equations (1)~(4), $I_{SD}$: source-drain current, $\mu$ and $\mu_{FET}$: charge carrier mobility, $C_o$: capacitance of the insulating layer, W: channel width, L: channel length; $V_G$: gate voltage, and $V_T$: threshold voltage.

Threshold voltage ($V_T$) was taken from the intersection where the $V_G$ axis intersects the extension of the linear portion of the graph representing the relationship between $(I_{SD})^{1/2}$ and $V_G$. As the absolute value of the threshold voltage approximates to zero, the consumption of electric power decreases.

(2) $I_{on}/I_{off}$ Ratio $I_{on}/I_{off}$ ratio can be determined from a ratio of a maximum current in the on-state to a minimum current in the off-state, and is represented by the following equation:

$$\frac{I_{on}}{I_{off}} = \left(\frac{\mu}{\sigma}\right) \frac{C_o^2}{qN_A t^2} V_D^2$$

wherein $I_{on}$: maximum current, $I_{off}$: off-state leakage current, $\mu$: charge carrier mobility, $\sigma$: conductivity of the active layer, q: electric charge, NA: electric charge density, t: thickness of the insulating layer, $C_0$: capacitance of the insulating layer, and $V_D$: drain voltage.

As can be seen from this equation, the larger the dielectric constant and the smaller the thickness of the dielectric film, the larger the $I_{on}/I_{off}$ ratio. Therefore, the kind and thickness of the dielectric film are crucial factors in determining the $I_{on}/I_{off}$ ratio. The off-state leakage current ($I_{off}$) is a current flowing in the off-state, and was determined from the minimum current in the off-state.

Measurement of Dielectric Constant:

First, each of the compositions prepared in Preparative Examples 3-5, and Comparative Preparation Example 1 was applied to an aluminum substrate to form a film having a thickness of 2,000 Å, and baked at 70° C. for 1 hour and at 100° C. for 30 minutes to form an insulating layer. Aluminum was deposited on the insulating layer to fabricate a metal-insulator-metal (MIM)-structured capacitor. The insulating properties and dielectric constant of the capacitor were measured at 20 Hz. The dielectric constant was calculated by the following equation.

(3) Capacitance Per Unit Area ($C_0$)

The dielectric constant, which is indicative of insulating properties, was calculated from the measured capacitance $C_0$ according to the following equation:

$$C_0 = \epsilon \epsilon_0 (A/d)$$

where A is the area of a device, d is the thickness of the insulator, and $\epsilon$ and $\epsilon_0$ are the dielectric constant of the insulator and vacuum, respectively.

The dielectric constant of the compositions prepared in Preparative Examples 1-3 and Comparative Preparation Example 1, and the driving characteristics of the organic thin film transistors fabricated using the respective compositions are summarized in Table 1 below.

TABLE 1

| Example No. | Dielectric constant (κ) | Charge carrier mobility (cm²/Vs) | Threshold voltage (V) | $I_{on}/I_{off}$ |
|---|---|---|---|---|
| Example 1 | 4.3 | 7.5 | 10 | 1.1 × 10⁶ |
| Example 2 | 5.1 | 8.9 | 8 | 3.2 × 10⁶ |
| Example 3 | 4.5 | 6.7 | 10 | 2.4 × 10⁶ |
| Comp. Ex. 1 | 4.0 | 2.4 | 8 | 1.0 × 10⁶ |

As can be seen from the data shown in Table 1, the compositions (Preparative Examples 1-3) comprising the respective organic-inorganic metal hybrid materials have higher dielectric constants than the composition (Comparative Preparation Example 1) comprising no organic-inorganic metal hybrid material. In addition, the transistors (Examples 1 to 3) fabricated using the respective compositions exhibit high charge carrier mobility while maintaining driving characteristics, i.e. threshold voltage and $I_{on}/I_{off}$ ratio.

As apparent from the foregoing, the organic-inorganic metal hybrid material of the present invention can be prepared by hydrolysis or polycondensation of an organosilane-based compound and an organometallic compound. In addition, the composition comprising the hybrid material can be prepared by a solution process and is excellent in insulating properties. Furthermore, the organic thin film transistor fabricated using the composition exhibits a high charge carrier mobility, low driving and threshold voltages, and superior stability in subsequent processing.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

We claim:

1. An organic-inorganic metal hybrid material represented by Formula 1 below:

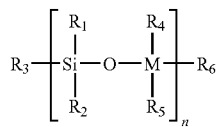

(1)

wherein n is 1;

M is a metal atom selected from titanium, zirconium, and hafnium atoms;

$R_1$, $R_2$ are methoxy groups, or $R_3$ is a vinyl group, or a methacryloxypropyl group, and $R_4$, $R_5$ and $R_6$ are isopropoxy groups.

2. The organic-inorganic metal hybrid material according to claim 1 wherein $R_3$ is vinyl.

3. The organic-inorganic metal hybrid material according to claim 1 wherein $R_3$ is methacryloxypropyl.

4. The organic-inorganic metal hybrid material according to claim 1 wherein M is titanium.

5. The organic-inorganic metal hybrid material according to claim 2 wherein M is titanium.

6. The organic-inorganic metal hybrid material according to claim 3 wherein M is titanium.

* * * * *